United States Patent
Lin et al.

(10) Patent No.: US 10,607,545 B2
(45) Date of Patent: Mar. 31, 2020

(54) ORGANIC LIGHT-EMITTING DIODE DRIVING CIRCUIT WITH SENSE THIN FILM TRANSISTORS SHARING GATE ELECTRODE AND SOURCE ELECTRODE, ARRAY SUBSTRATE AND DISPLAY DEVICE

(71) Applicant: BOE Technology Group Co., Ltd., Beijing (CN)

(72) Inventors: Yicheng Lin, Beijing (CN); Quanhu Li, Beijing (CN); Cuili Gai, Beijing (CN); Baoxia Zhang, Beijing (CN); Longyan Wang, Beijing (CN); Ling Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 109 days.

(21) Appl. No.: 15/736,519

(22) PCT Filed: Jun. 30, 2017

(86) PCT No.: PCT/CN2017/090971
§ 371 (c)(1),
(2) Date: Dec. 14, 2017

(87) PCT Pub. No.: WO2018/082325
PCT Pub. Date: May 11, 2018

(65) Prior Publication Data
US 2019/0066588 A1 Feb. 28, 2019

(30) Foreign Application Priority Data
Nov. 2, 2016 (CN) .......................... 2016 1 0945414

(51) Int. Cl.
*G09G 3/3258* (2016.01)
*H01L 27/32* (2006.01)
*G09G 3/3233* (2016.01)

(52) U.S. Cl.
CPC ......... *G09G 3/3258* (2013.01); *G09G 3/3233* (2013.01); *H01L 27/3262* (2013.01);
(Continued)

(58) Field of Classification Search
CPC ... G09G 2300/0426; G09G 2300/0809; G09G 2320/0204
See application file for complete search history.

(56) References Cited

U.S. PATENT DOCUMENTS

| 9,147,723 B1 | 9/2015 | Lee et al. |
| 2008/0100227 A1* | 5/2008 | Iwabuchi ............. G09G 3/3266 315/169.3 |

(Continued)

FOREIGN PATENT DOCUMENTS

| CN | 1949513 A | 4/2007 |
| CN | 103578411 A | 2/2014 |

(Continued)

OTHER PUBLICATIONS

Chinese Search Report for Chinese Patent Application No. 201610945414.0, dated Mar. 2, 2017, 11 pages.

(Continued)

*Primary Examiner* — Chun-Nan Lin
(74) *Attorney, Agent, or Firm* — Westman, Champlin & Koehler, P.A.

(57) ABSTRACT

An OLED driving circuit, an array substrate and a display device are provided. The OLED driving circuit includes a plurality of driving TFTs and a plurality of sense TFTs. Each sense TFT is configured to compensate for a threshold voltage of the respective driving TFT. Each sense TFT corresponds to a respective one of the driving TFTs, a source electrode of each sense TFT is connected to a sense line, and a drain electrode thereof is connected to a drain electrode of the respective driving TFT. The plurality of sense TFTs is (Continued)

divided into a plurality of groups, each group includes at least two sense TFTs which share a same gate electrode and a same source electrode and are connected to a same sense line.

11 Claims, 6 Drawing Sheets

(52) U.S. Cl.
CPC ............... *G09G 2300/0426* (2013.01); *G09G 2300/0809* (2013.01); *G09G 2320/0204* (2013.01); *G09G 2320/0295* (2013.01)

(56) References Cited

U.S. PATENT DOCUMENTS

| | | | |
|---|---|---|---|
| 2014/0022289 A1 | 1/2014 | Lee et al. | |
| 2014/0111557 A1 | 4/2014 | Omata et al. | |
| 2015/0170565 A1* | 6/2015 | Hong | G09G 3/3233 345/212 |
| 2016/0240565 A1* | 8/2016 | Kim | H01L 27/1251 |
| 2017/0169767 A1 | 6/2017 | Song | |

FOREIGN PATENT DOCUMENTS

| | | |
|---|---|---|
| CN | 103778886 A | 5/2014 |
| CN | 103941510 A | 7/2014 |
| CN | 104715717 A | 6/2015 |
| CN | 104809986 A | 7/2015 |
| CN | 105374843 A | 3/2016 |
| CN | 105629607 A | 6/2016 |
| CN | 106297668 A | 1/2017 |
| KR | 1020090043301 A | 5/2009 |
| KR | 20160006299 A | 1/2016 |

OTHER PUBLICATIONS

International Search Report and Written Opinion for International Application No. PCT/CN2017/090971, dated Sep. 22, 2017, 14 pages.
English translation of Written Opinion of the International Search Report, dated Sep. 22, 2017, for International Application No. PCT/CN2017/090971, 2 pages.
Second Office Action for Chinese Patent Application No. 201610945414.0, dated Sep. 1, 2017, 12 pages.
First Office Action, including Search Report, for Chinese Patent Application No. 201610945414.0, dated May 10, 2017, 12 pages.

* cited by examiner

US 10,607,545 B2

ORGANIC LIGHT-EMITTING DIODE DRIVING CIRCUIT WITH SENSE THIN FILM TRANSISTORS SHARING GATE ELECTRODE AND SOURCE ELECTRODE, ARRAY SUBSTRATE AND DISPLAY DEVICE

CROSS-REFERENCE TO RELATED APPLICATION

The present application is the U.S. national phase of PCT Application No. PCT/CN2017/090971 filed on Jun. 30, 2017, which claims a priority of the Chinese patent application No. 201610945414.0 filed on Nov. 2, 2016, which are incorporated herein by reference in their entirety.

TECHNICAL FIELD

The present disclosure relates to the field of display technology, in particular to an organic light-emitting diode (OLED) driving circuit, an array substrate and a display device.

BACKGROUND

Recently, active-matrix organic light-emitting diode (AMOLED) display devices have become more and more popular due to such advantages as ultrahigh contrast, very small thickness, very wide color gamut, wide viewing angle, very rapid response, and being capable of being curved at a very high curvature.

The AMOLED display device includes an OLED array substrate, which includes an OLED and a driving thin film transistor (TFT) for driving the OLED. A threshold voltage (Vth) drift may easily occur for the driving TFT, especially for an oxide TFT, so an external electrical compensation mechanism needs to be provided, so as to compensate for a threshold voltage of the TFT, thereby to improve a display effect of the AMOLED display device.

For the external electrical compensation mechanism, sufficient time and charging speed are required so as to achieve an optimum compensation effect. However, along with an increase in a size and a resolution of the display device, a resistance-capacitance (RC) loading of a sense line may increase remarkably. Hence, the sense line is charged at a small charging rate or insufficiently, and thereby it is impossible to achieve the desired compensation effect.

SUMMARY

An object of the present disclosure is to provide an OLED driving circuit, an array substrate and a display device, so as to charge the sense line of the OLED driving circuit at a high charging rate or sufficiently, thereby to improve a compensation effect.

In one aspect, the present disclosure provides in some embodiments an OLED driving circuit, including: a plurality of driving TFTs each corresponding to an OLED and configured to driving the OLED to emit light, a source electrode of each driving TFT being connected to a power source, and a drain electrode of each driving TFT being connected to the corresponding OLED; and a plurality of sense TFTs each corresponding to one of the driving TFTs and configured to compensate for a threshold voltage of the corresponding driving TFT, a source electrode of each sense TFT being connected to a sense line, and a drain electrode of each sense TFT being connected to the drain electrode of the corresponding driving TFT. The plurality of sense TFTs is divided into a plurality of groups, each group includes at least two sense TFTs, subpixels corresponding to the at least two sense TFTs are arranged adjacent to each other, the at least two sense TFTs share a same gate electrode and a same source electrode, and the source electrode shared by the at least two sense TFTs is connected to a same sense line.

In a possible embodiment of the present disclosure, each group includes two sense TFTs, and a source electrode is shared by the two sense TFTs.

In a possible embodiment of the present disclosure, the two sense TFTs in each group share a same active layer.

In a possible embodiment of the present disclosure, the active layers of the two sense TFTs in each group are arranged separately.

In a possible embodiment of the present disclosure, each group includes four sense TFTs.

In a possible embodiment of the present disclosure, the four sense TFTs include a first sense TFT, a second sense TFT, a third sense TFT and a fourth sense TFT. The first sense TFT and the second sense TFT share a same active layer, and the third sense TFT and the fourth sense TFT share another same active layer.

In a possible embodiment of the present disclosure, the active layers of the four sense TFTs in each group are arranged separately.

In a possible embodiment of the present disclosure, subpixels corresponding to the four sense TFTs in each group are arranged in two rows and two columns.

In a possible embodiment of the present disclosure, a source electrode is shared by the four sense TFTs in each group.

In a possible embodiment of the present disclosure, the four sense TFTs in each group correspond to a red subpixel, a green subpixel, a blue subpixel and a white subpixel respectively.

In a possible embodiment of the present disclosure, the drain electrode of each sense TFT is connected to a gate electrode of the respective driving TFT through a capacitor.

In another aspect, the present disclosure provides in some embodiments an OLED array substrate, including an OLED and the above-mentioned OLED driving circuit for driving the OLED.

In yet another aspect, the present disclosure provides in some embodiments an OLED display device including the above-mentioned OLED array substrate.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort. Shapes and sizes of the members in the drawings are for illustrative purposes only, but shall not be used to reflect any actual scale.

DETAILED DESCRIPTION OF THE EMBODIMENTS

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Figure 1:
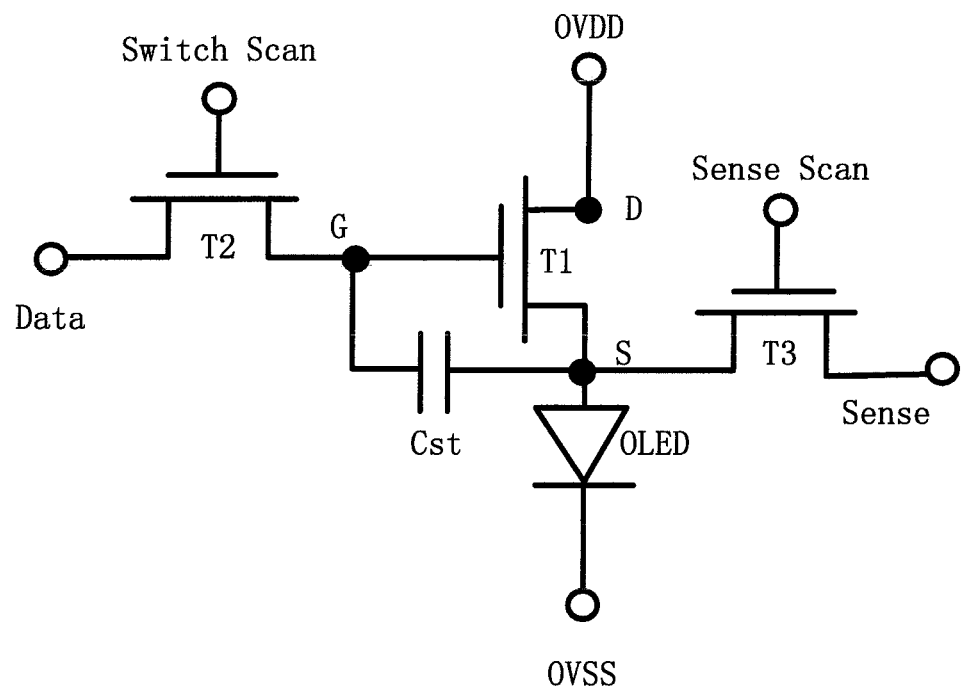
FIG. 1 is a circuit diagram of an OLED array substrate in the related art.

As shown in FIG. 1, an OLED array substrate includes an OLED and a driving circuit for driving the OLED. The driving circuit includes a driving TFT T1, a switching TFT T2 and a capacitor Cst. In order to compensate for a threshold voltage of the driving TFT T1, the driving circuit further include a sense TFT T3, a gate electrode of which is configured to receive a sense scanning signal (Sense Scan), a source electrode of which is configured to receive a sense signal through a sense line, and a drain electrode of which is connected to an anode of the OLED. In FIG. 1, Switch Scan represents a switch scanning signal, Data represents a data signal, OVDD represents an operating voltage, OVSS represents a voltage of a grounding end, and D, G and S represents nodes respectively.

In order to charge the sense line of the OLED driving circuit at a high charging rate or sufficiently, thereby to improve a compensation effect, the present disclosure provides in some embodiments a plurality of driving thin film transistors (TFTs), wherein each of the driving TFTs is configured to driving a respective OLED to emit light, a source electrode of each driving TFT is connected to a power source, and a drain electrode of each driving TFT is connected to the respective OLED; and a plurality of sense TFTs, wherein each of the sense TFTs is configured to compensate for a threshold voltage of a respective one of the driving TFTs, a source electrode of each sense TFT is connected to a sense line, and a drain electrode of each sense TFT is connected to the drain electrode of the respective driving TFT. The plurality of sense TFTs is divided into a plurality of groups, each group comprises at least two sense TFTs, subpixels corresponding to the at least two sense TFTs are arranged adjacent to each other, the at least two sense TFTs share a same gate electrode and a same source electrode, and the source electrode shared by the at least two sense TFTs is connected to a same sense line.

According to the embodiments of the present disclosure, the two or more sense TFTs share a same gate electrode and a same source electrode and are connected to a same sense line. As compared with the driving circuit in the related art where the sense TFTs are arranged separately (i.e., the sense TFTs do not share the same gate electrode or the same source electrode), it is able to reduce the number of the source electrodes and the gate electrodes, thereby to reduce an overlapping area between the source electrode and the gate electrode of each sense TFT, and reduce a parasitic capacitance between the source electrode and the gate electrode of each sense TFT. In addition, it is able to reduce a cross-line overlapping area of the sense line and reduce the capacitance for the RC loading of the sense line, thereby to increase a charging rate of the sense line and achieve a desired compensation effect.

In a possible embodiment of the present disclosure, the gate electrodes, the source electrodes and the sense lines are each made of a metal.

In a possible embodiment of the present disclosure, each sense line is arranged parallel to a data line.

In a possible embodiment of the present disclosure, the subpixels are arranged adjacent to each other in a row direction or in a column direction.

The present disclosure further provides in some embodiments an array substrate which includes a plurality of subpixels, and each subpixel includes an OLED and the above-mentioned driving circuit.

Figure 2:
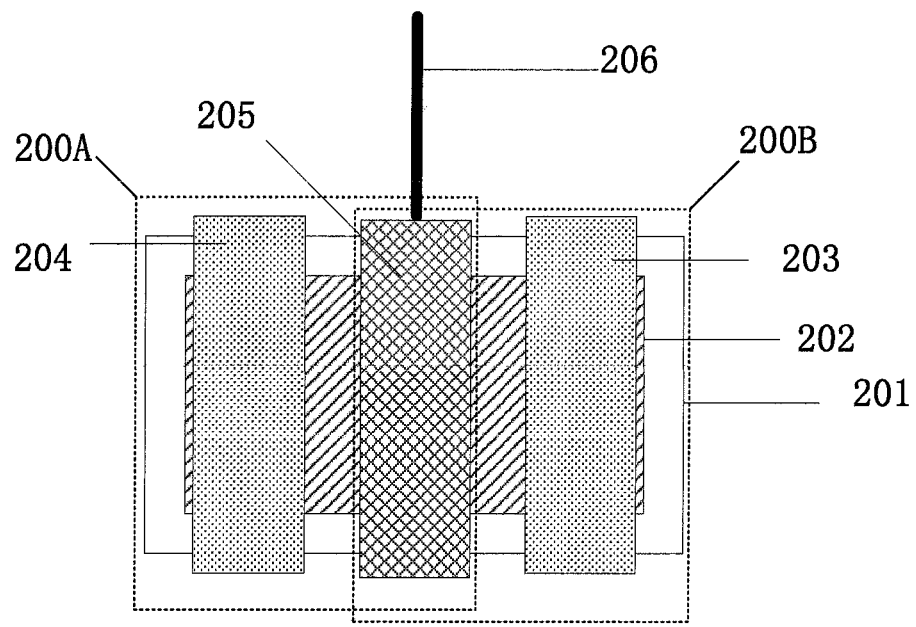
FIG. 2 is a schematic view showing an OLED driving circuit according to one embodiment of the present disclosure.

Referring to FIG. 2 which is a schematic view showing the OLED driving circuit, the plurality of sense TFTs is divided into a plurality of groups, and each group includes two sense TFTs (i.e., a sense TFT 200A and a sense TFT 200B). Subpixels corresponding to the sense TFTs 200A and 200B are arranged adjacent to each other, the sense TFTs 200A and 200B share a same gate electrode 201 and a same source electrode 205, and the source electrode 205 is connected to a same sense line 206. In addition, a drain electrode of the sense TFT 200A is connected to a drain electrode of the corresponding driving TFT (not shown), and a drain electrode 203 of the sense TFT 200B is connected to a drain electrode of the corresponding driving TFT (not shown).

In FIG. 2, the reference sign 202 represents an active layer. In the embodiments of the present disclosure, the sense TFT 200A and the sense TFT 200B share a same active layer 202. Of course, in some other embodiments of the present disclosure, they may not share a same active layer, i.e., the active layers of the two sense TFTs may be arranged separately.

According to the embodiments of the present disclosure, the two sense TFTs share a same gate electrode and a same source electrode and are connected to a same sense line. As compared with the driving circuit in the related art where the sense TFTs are arranged separately (i.e., the sense TFTs do not share the same gate electrode or the same source electrode), it is able to reduce the number of the source electrodes and the gate electrodes, thereby to reduce an overlapping area between the source electrode and the gate electrode of each sense TFT, and reduce a parasitic capacitance between the source electrode and the gate electrode of each sense TFT by half. In addition, it is able to reduce a cross-line overlapping area of the sense line and reduce the capacitance for the RC loading of the sense line, thereby to increase a charging rate of the sense line and achieve a desired compensation effect.

In the embodiments of the present disclosure, the source electrode is shared by the two sense TFTs, so as to ensure normal operation of the two sense TFTs. In a possible embodiment of the present disclosure, the source electrode is separated from the drain electrodes of the two sense TFTs at a same distance.

Figure 3:
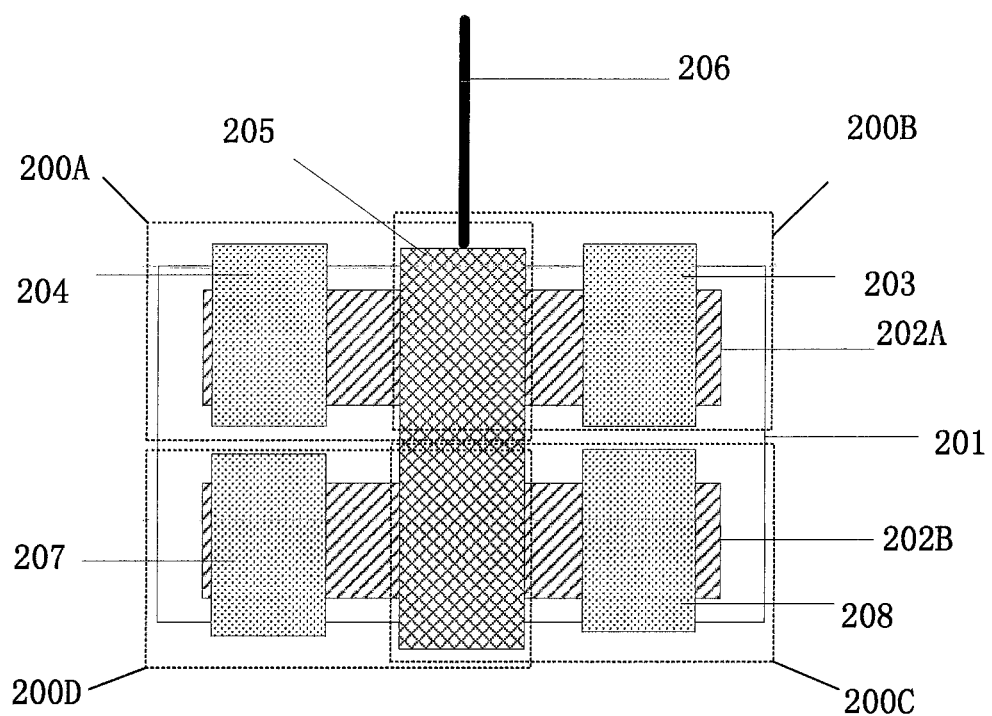
FIG. 3 is another schematic view showing the OLED driving circuit according to one embodiment of the present disclosure.

Referring to FIG. 3 which is another schematic view showing the OLED driving circuit, the plurality of sense TFTs is divided into a plurality of groups, and each group includes four sense TFTs (i.e., a sense TFT 200A, a sense TFT 200B, a sense TFT 200C and a sense TFT 200D). Subpixels corresponding to the sense TFT 200A, the sense TFT 200B, the sense TFT 200C and the sense TFT 200D are arranged adjacent to each other, the sense TFT 200A, the sense TFT 200B, the sense TFT 200C and the sense TFT 200D share a same gate electrode 201 and a same source electrode 205, and the source electrode 205 is connected to a same sense line 206. In addition, drain electrodes (i.e., a drain electrode 203, a drain electrode 204, a drain electrode 207 and a drain electrode 208) of the four sense TFTs 200A, 200B, 200C, 200D are connected to drain electrodes of the respective driving TFTs (not shown).

In FIG. 3, the reference sign 202 represents an active layer. In the embodiments of the present disclosure, the sense TFT 200A and the sense TFT 200B share a same active layer 202A, and the sense TFT 200C and the sense TFT 200D share a same active layer 202B. Of course, in some other embodiments of the present disclosure, the active layers of the four sense TFTs may be arranged in another manner. For example, each of the four sense TFTs has a respective active layer, or the four sense TFTs share a same active layer, or the sense TFTs 200A and 200D share a same active layer while the sense TFTs 200B and 200C share a same active layer.

According to the embodiments of the present disclosure, the four sense TFTs share a same gate electrode and a same source electrode and are connected to a same sense line. As compared with the driving circuit in the related art where the sense TFTs are arranged separately (i.e., the sense TFTs do not share the same gate electrode or the same source electrode), it is able to reduce the number of the source electrodes and the gate electrodes, thereby to reduce an overlapping area between the source electrode and the gate electrode of each sense TFT, and reduce a parasitic capacitance between the source electrode and the gate electrode of each sense TFT by three quarters. In addition, it is able to reduce a cross-line overlapping area of the sense line and reduce the capacitance for the RC loading of the sense line, thereby to increase a charging rate of the sense line and achieve a desired compensation effect.

In the embodiments of the present disclosure, the source electrode is shared by the four sense TFTs in each group, so as to ensure normal operation of the four sense TFTs. In a possible embodiment of the present disclosure, the source electrode is separated from the drain electrodes of the four sense TFTs at a same distance.

In a possible embodiment of the present disclosure, subpixels corresponding to the four sense TFTs in each group are arranged in two rows and two columns.

In a possible embodiment of the present disclosure, the four sense TFTs in each group correspond to a red subpixel, a green subpixel, a blue subpixel and a white subpixel respectively.

The structure of the driving circuit for each subpixel may refer to FIG. 1. The driving circuit in the embodiments of the present disclosure differs from the driving circuit in the related art in that the sense TFT T3 of the driving circuit for one subpixel and the sense TFT T3 of the driving circuit for an adjacent subpixel share the same gate electrode and the same source electrode.

The present disclosure further provides in some embodiments an OLED array substrate including an OLED and the above-mentioned driving circuit for driving the OLED.

The present disclosure further provides in some embodiments an OLED display device including the above-mentioned OLED array substrate.

Figure 4:
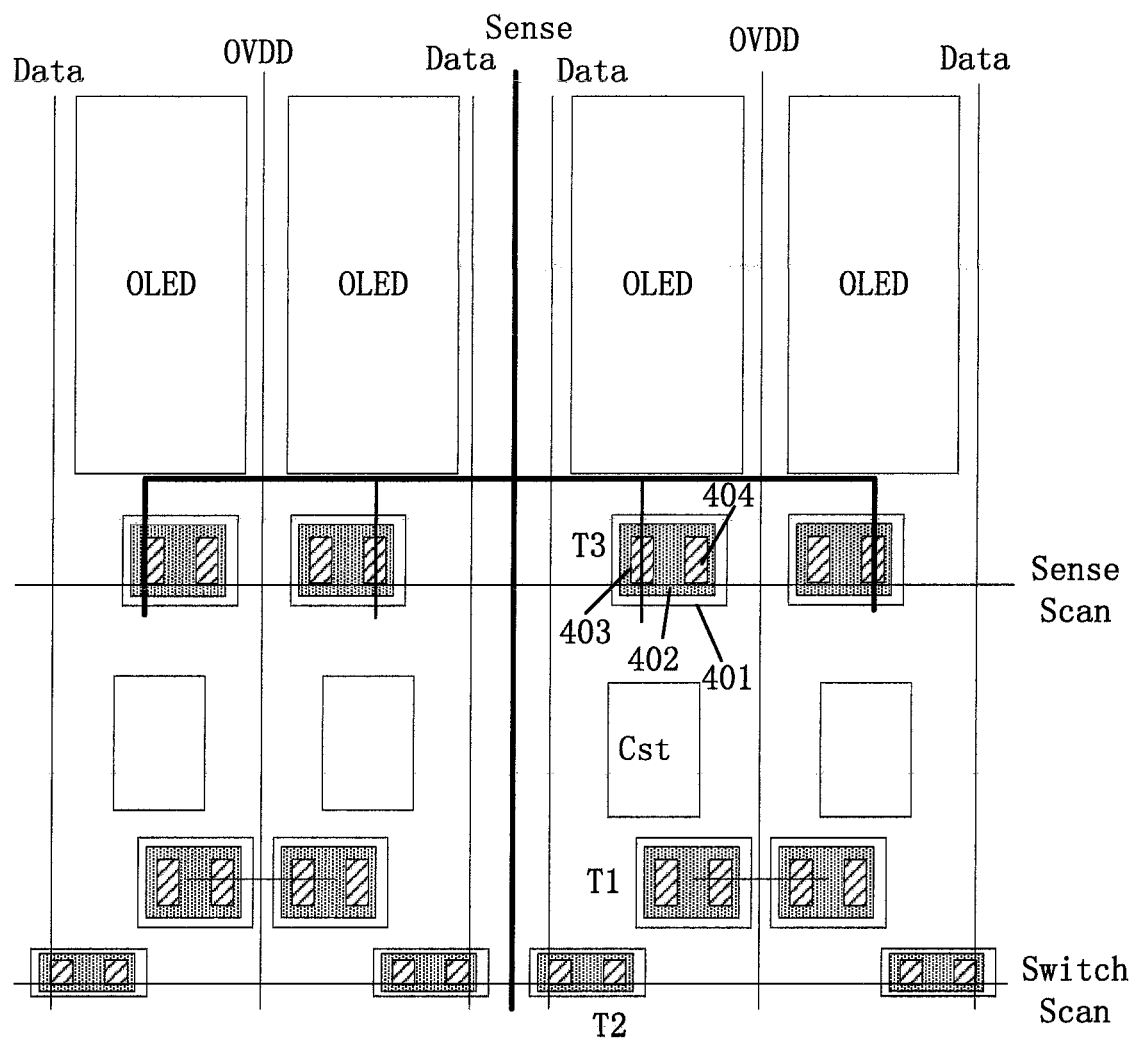
FIG. 4 is a schematic view showing an OLED array substrate in the related art.
Figure 5:
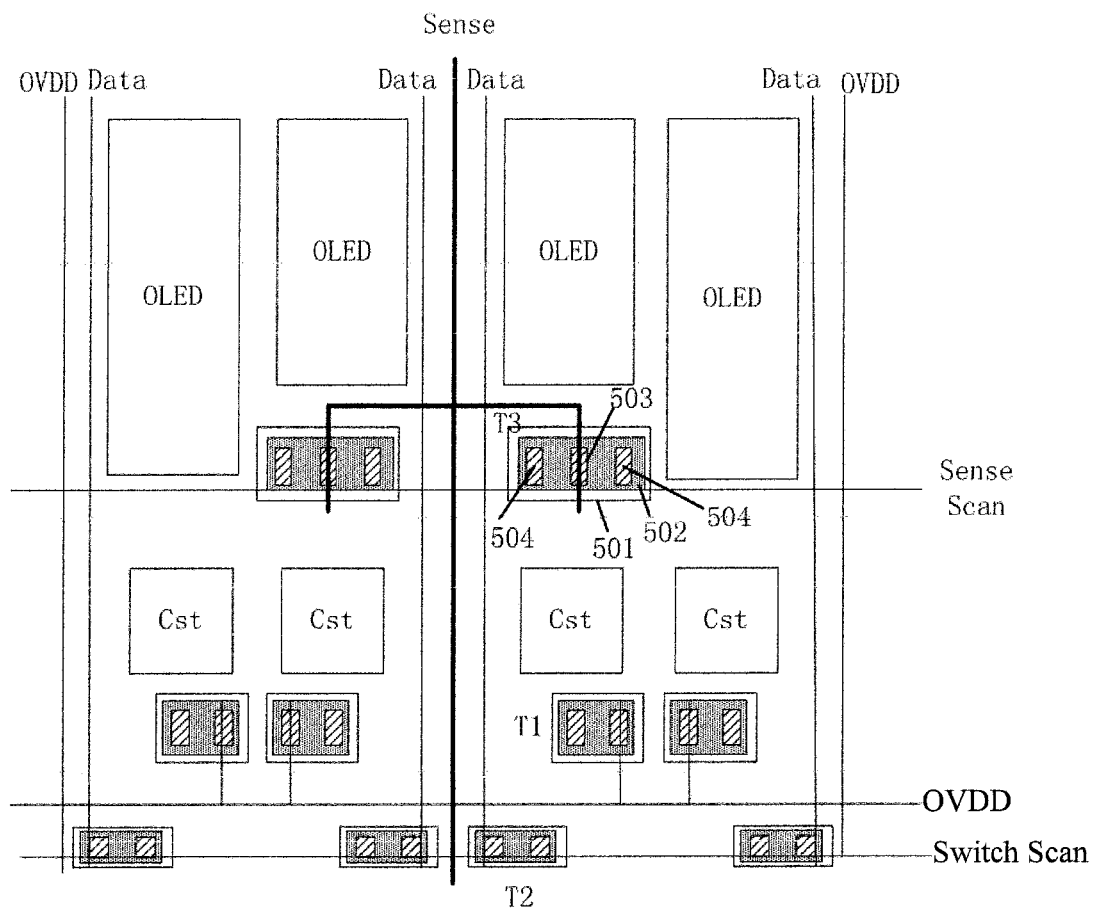
FIG. 5 is a schematic view showing an OLED array substrate according to one embodiment of the present disclosure.

FIG. 4 is a schematic view showing an OLED array substrate in the related art, and FIG. 5 is a schematic view showing the OLED array substrate according to one embodiment of the present disclosure.

The OLED array substrate in each of FIGS. 4 and 5 includes a plurality of OLEDs and a driving circuit for driving the OLEDs. The driving circuit includes a driving TFT T1, a switching TFT T2, a capacitor Cst and a sense TFT T3. A gate electrode of the sense TFT T3 is connected to a sense scanning signal (Sense Scan), a source electrode thereof is connected to a sense signal through a sense line, and a drain electrode thereof is connected to an anode of the respective OLED. In FIGS. 4 and 5, Switch Scan represents a switch scanning signal, Data represents a data signal, and OVDD represents an operating voltage. FIG. 1 shows a specific connection relationship of the circuit.

As shown in FIG. 4, for the OLED array substrate in the related art, each OLED corresponds to a respective sense TFT T3, and each sense TFT T3 includes a gate electrode 401, an active layer 402, a source electrode 403 and a drain electrode 404. The respective sense TFTs T3 corresponding to the OLEDs are arranged separately.

As shown in FIG. 5, for the OLED array substrate in the embodiments of the present disclosure, each OLED corresponds to a respective sense TFT T3, and each sense TFT T3 includes a gate electrode 501, an active layer 502, a source electrode 503 and a drain electrode 504. The sense TFTs T3 are divided into a plurality of groups, and each group includes two sense TFTs T3. The two sense TFTs T3 in each group share the same source electrode 503 and the gate electrode 501, and the source electrode 503 is connected to a same sense line. In FIG. 5, the two sense TFTs T3 located at a left side of the sense line belong to a same group, and the two sense TFTs T3 located at a right side of the sense line belong to a same group.

As indicated by the differences between FIG. 4 with FIG. 5, it is able for the OLED array substrate in the embodiments of the present disclosure to reduce the number of the source electrodes and the gate electrodes, thereby to reduce an overlapping area between the source electrode and the gate electrode of each sense TFT, and reduce a parasitic capacitance between the source electrode and the gate electrode of each sense TFT by half. In addition, it is able to reduce a cross-line overlapping area of the sense line and reduce the capacitance for the RC loading of the sense line, thereby to increase a charging rate of the sense line and achieve a desired compensation effect.

Figure 6:
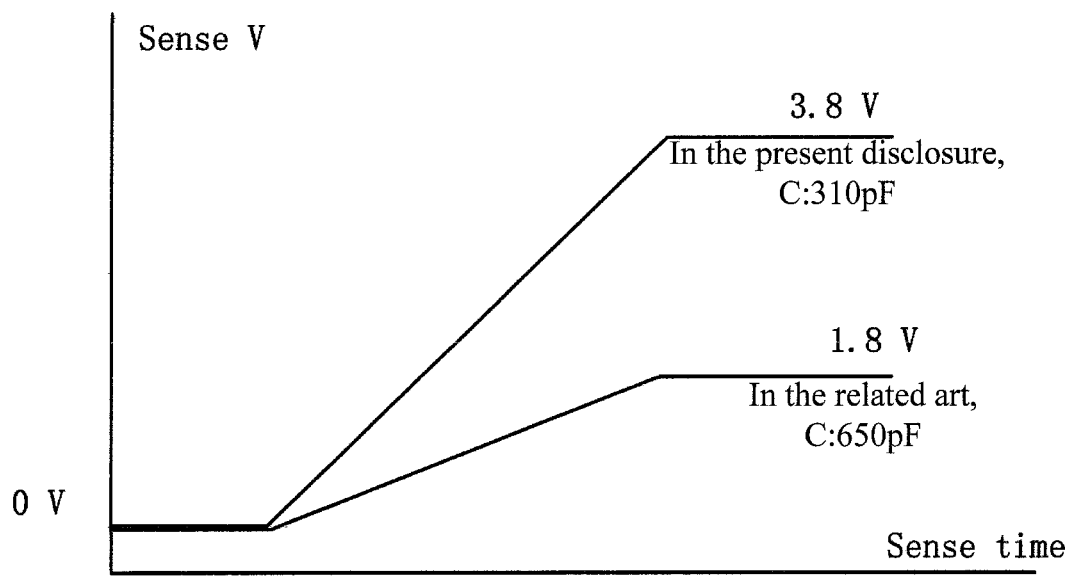
FIG. 6 is a schematic view showing simulation results of an effect of the RC loading of the sense line on charging capability at a sense stage between the OLED array substrates in FIGS. 4 and 5.

FIG. 6 is a schematic view showing simulation results of the effect of the RC loading of the sense line on charging capability at a sense stage between the OLED array substrates in FIGS. 4 and 5. In FIG. 6, an x-axis coordinate represents sense time, a y-axis coordinate represents a sense voltage, and C represents a capacitance of the sense line. As can be seen from FIG. 6, it is able for the OLED display device in the embodiments of the present disclosure to remarkably increase the charging rate for the sense line, thereby to achieve a better compensation effect.

Figure 7:
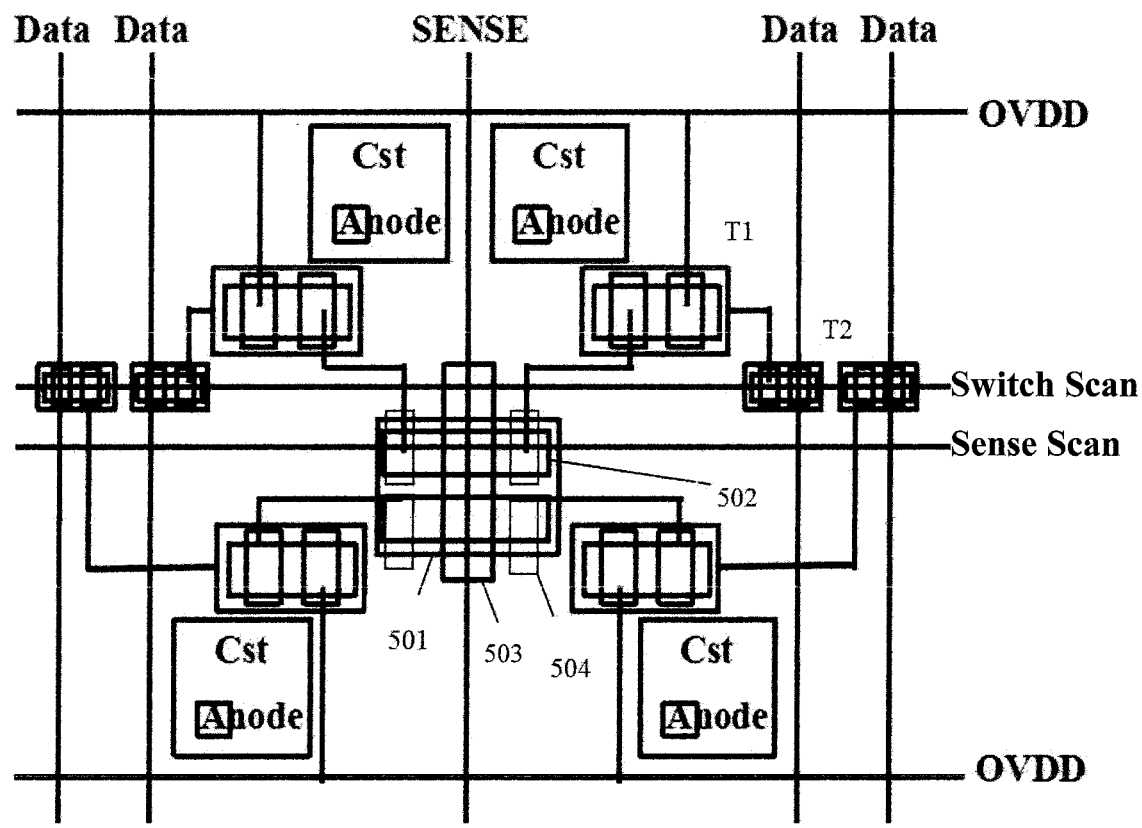
FIG. 7 is another schematic view showing the OLED array substrate according to one embodiment of the present disclosure.

FIG. 7 is another schematic view showing the OLED array substrate according to one embodiment of the present disclosure. The OLED array substrate includes a plurality of OLEDs and a driving circuit for driving the OLEDs. The driving circuit includes a driving TFT T1, a switching TFT T2, a capacitor Cst and a sense TFT T3. A gate electrode of the sense TFT T3 is configured to receive a sense scanning signal (Sense Scan), a source electrode thereof is configured to receive a sense signal (Sense) through a sense line, and a drain electrode thereof is connected to an anode of the respective OLED. In FIG. 7, Switch Scan represents a switch scanning signal, Data represents a data signal and OVDD represents an operating voltage. FIG. 1 shows a specific connection relationship of the circuit.

As shown in FIG. 7, for the OLED array substrate in the embodiments of the present disclosure, each OLED corresponds to a respective sense TFT T3, and each sense TFT T3 includes a gate electrode 501, an active layer 502, a source electrode 503 and a drain electrode 504. The sense TFTs T3 are divided into a plurality of groups, and each group includes four sense TFTs T3. The four sense TFTs T3 in each group share a same source electrode 803 and a same gate electrode 801, and the source electrode 803 is connected to a same sense line.

For the OLED array substrate in FIG. 7, each OLED corresponds to a respective subpixel. The four OLEDs in FIG. 7 correspond to four subpixels, i.e., a red (R) subpixel, a green (G) subpixel, a blue (B) subpixel and a white (W) subpixel, respectively.

As can be seen from FIG. 7, it is able for the OLED array substrate in the embodiments of the present disclosure to reduce the number of the source electrodes and the gate electrodes, thereby to reduce an overlapping area between the source electrode and the gate electrode of each sense TFT, and reduce a parasitic capacitance between the source electrode and the gate electrode of each sense TFT by three quarters. In addition, it is able to reduce a cross-line overlapping area of the sense line and reduce the capacitance for the RC loading of the sense line, thereby to increase a charging rate of the sense line and achieve a desired compensation effect.

Figure 8:
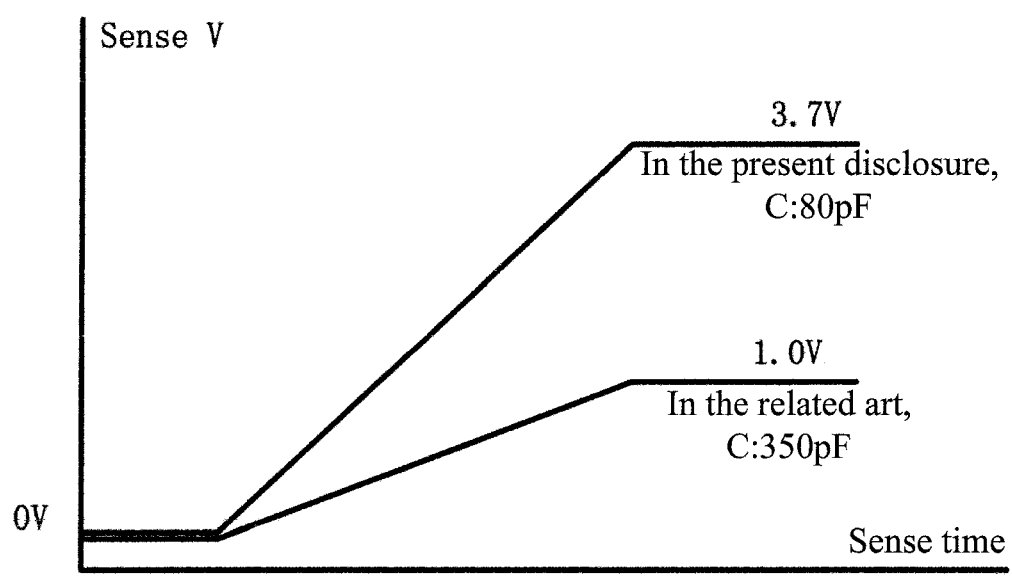
FIG. 8 is another schematic view showing the simulation results of the effect of the RC loading of the sense line on the charging capability at the sense state between the OLED array substrate in FIG. 7 and the OLED array substrate in the related art.

FIG. 8 is another schematic view showing the simulation results of the effect of the RC loading of the sense line on the charging capability at the sense stage between the OLED array substrate in FIG. 7 and the OLED array substrate in the related art. In FIG. 8, an x-axis coordinate represents sense time, a y-axis coordinate represents a sense voltage, and C represents a capacitance of the sense line. As can be seen from FIG. 8, it is able for the OLED display device in the embodiments of the present disclosure to remarkably increase the charging rate for the sense line, thereby to achieve a better compensation effect.

Figure 9:
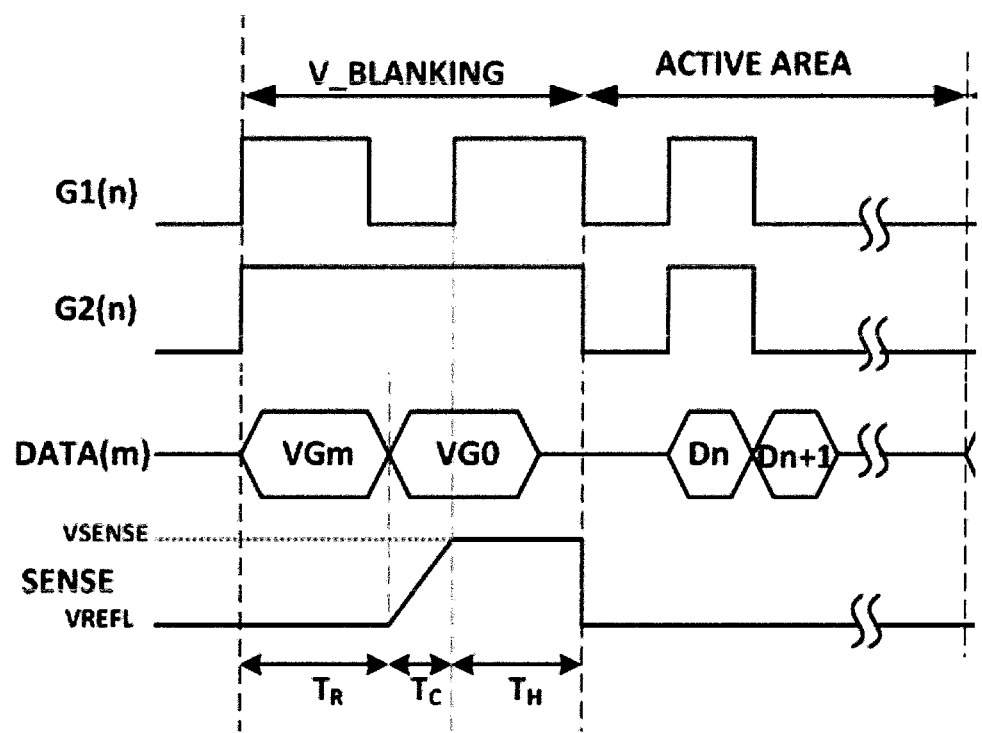
FIG. 9 is a sequence diagram of driving signals for the OLED driving circuit according to one embodiment of the present disclosure.

An operation procedure of the OLED driving circuit in the embodiments of the present disclosure will be described hereinafter briefly. The connection relationship of the OLED driving circuit may refer to FIG. 1. As shown in FIG. 9, the operation procedure of the OLED driving circuit usually includes three stages, i.e., a sense stage, a compensation stage and an emission stage. At the sense stage, a voltage is applied to G1 and G2 so as to charge the sense TFT. At the compensation stage, a value of the data signal is adjusted in accordance with a result acquired at the sense stage, so as to perform the compensation. At the emission stage, the sense TFT is charged to be at a voltage equal to a predetermined Vgs, then no voltage is applied to G1 and G2, and then the OLED emits light. In FIG. 9, V_BLANKING represents that a display panel does not emit light within a short time of each time period, ACTIVE AREA represents a normal light-emission stage, G1($n$) represents a G1 waveform, G2($n$) represents a G2 waveform, VGm represents a maximum voltage of the data signal, VG0 represents a minimum voltage of the data signal, TR represents reset time, Tc represents charging time, TH represents holding time, VSENSE represents a voltage across the sense TFT in the case that sense TFT is in a floating state, and VREFL represents a reference voltage inputted in the case of the sense TFT is not in the floating state (usually at this time it is grounded).

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. An organic light-emitting diode (OLED) driving circuit, comprising:
   a plurality of driving thin film transistors (TFTs), wherein each of the driving TFTs is configured to driving a respective OLED to emit light, an operating voltage is applied to a source electrode of each driving TFT, and a drain electrode of each driving TFT is connected to the respective OLED; and
   a plurality of sense TFTs, wherein each of the sense TFTs is configured to compensate for a threshold voltage of a respective one of the driving TFTs, a source electrode of each sense TFT is connected to a sense line, and a drain electrode of each sense TFT is connected to the drain electrode of the respective driving TFT,
   wherein the plurality of sense TFTs is divided into a plurality of groups, each group comprises at least two sense TFTs, subpixels corresponding to the at least two sense TFTs are arranged adjacent to each other, the at least two sense TFTs share a same gate electrode and a same source electrode, the source electrode shared by the at least two sense TFTs is connected to a same sense line, all of the at least two sense TFTs share one active layer, the one active layer is continuous, and the one active layer is arranged on one plane and in direct contact with the one plane;
   an entirety of an orthographic projection of the one active layer onto the one plane is within an orthographic projection of the gate electrode shared by the at least two sense TFTs onto the one plane; and the drain electrode of each sense TFT is connected to a gate electrode of the respective driving TFT through a capacitor, and the capacitor is connected directly to the drain electrode of the sense TFT and the gate electrode of the driving TFT.

2. The OLED driving circuit according to claim 1, wherein each group comprises four sense TFTs.

3. The OLED driving circuit according to claim 2, wherein the four sense TFTs comprise a first sense TFT, a second sense TFT, a third sense TFT and a fourth sense TFT; and the first sense TFT, the second sense TFT, the third sense TFT and the fourth sense TFT share the one active layer.

4. The OLED driving circuit according to claim 2, wherein subpixels corresponding to the four sense TFTs in each group are arranged in two rows and two columns.

5. The OLED driving circuit according to claim 4, wherein a source electrode is shared by the four sense TFTs in each group.

6. The OLED driving circuit according to claim 4, wherein the four sense TFTs in each group correspond to a red subpixel, a green subpixel, a blue subpixel and a white subpixel respectively.

7. An organic light-emitting diode (OLED) array substrate, comprising an OLED and the OLED driving circuit according to claim 1 for driving the OLED.

8. An organic light-emitting diode (OLED) display device, comprising the OLED array substrate according to claim 7.

9. The OLED array substrate according to claim 7, wherein each group comprises four sense TFTs.

10. The OLED array substrate according to claim 9, wherein the four sense TFTs comprise a first sense TFT, a second sense TFT, a third sense TFT and a fourth sense TFT; and the first sense TFT, the second sense TFT, the third sense TFT and the fourth sense TFT share the one active layer.

11. The OLED array substrate according to claim 9, wherein subpixels corresponding to the four sense TFTs in each group are arranged in two rows and two columns.

* * * * *